United States Patent
Seddon et al.

(10) Patent No.: US 11,075,103 B2
(45) Date of Patent: *Jul. 27, 2021

(54) BACKSIDE WAFER ALIGNMENT METHODS

(71) Applicant: SEMICONDUCTOR COMPONENTS INDUSTRIES, LLC, Phoenix, AZ (US)

(72) Inventors: Michael J. Seddon, Gilbert, AZ (US); Takashi Noma, Ota (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/987,236

(22) Filed: Aug. 6, 2020

(65) Prior Publication Data

US 2020/0365440 A1  Nov. 19, 2020

Related U.S. Application Data

(63) Continuation of application No. 16/505,967, filed on Jul. 9, 2019, now Pat. No. 10,755,956.

(60) Provisional application No. 62/796,680, filed on Jan. 25, 2019.

(51) Int. Cl.
*H01L 21/68* (2006.01)
*H01L 21/768* (2006.01)
*H01L 21/78* (2006.01)

(52) U.S. Cl.
CPC ...... *H01L 21/681* (2013.01); *H01L 21/76871* (2013.01); *H01L 21/78* (2013.01)

(58) Field of Classification Search
None
See application file for complete search history.

(56) References Cited

U.S. PATENT DOCUMENTS

| | | | |
|---|---|---|---|
| 10,755,956 B2* | 8/2020 | Seddon | H01L 21/78 |
| 2008/0079152 A1 | 4/2008 | Tanaka et al. | |
| 2009/0110878 A1 | 4/2009 | Pratt et al. | |
| 2012/0056315 A1 | 3/2012 | Chang et al. | |
| 2017/0025349 A1* | 1/2017 | Wood | H01L 21/6835 |

OTHER PUBLICATIONS

Definition of "Glop" Downloaded from URL<https://www.merriam-webster.com/dictionary/glop on Apr. 27, 2021 (Year: 2021).*
Definition of 'Glop' downloaded from URL< https://www.vocabulary.com/dictionary/glop> on Apr. 27, 2021 (Year: 2021).*

* cited by examiner

*Primary Examiner* — J. E. Schoenholtz
(74) *Attorney, Agent, or Firm* — Adam R. Stephenson, LTD.

(57) ABSTRACT

Implementations of a method for wafer alignment may include: providing a wafer having a first side and a second side and forming a seed layer on a second side of the wafer. The method may include applying a glop to the seed layer at two or more predetermined points and plating a metal layer over the seed layer and around the glop. The method may include removing the glop to expose the seed layer and etching the seed layer to expose a plurality of alignment features on the second side of the wafer.

16 Claims, 2 Drawing Sheets

BACKSIDE WAFER ALIGNMENT METHODS

CROSS REFERENCE TO RELATED APPLICATIONS

This application is a continuation application of U.S. Ser. No. 16/505,967 to Seddon et al., entitled "Backside Wafer Alignment Methods," filed Jul. 9, 2019, now pending; which application claims the benefit of the filing date of U.S. Provisional Patent Application 62/796,680, entitled "BACKSIDE WAFER ALIGNMENT METHODS" to Seddon et al., which was filed on Jan. 25, 2019, the disclosure of which is hereby incorporated entirely herein by reference.

BACKGROUND

1. Technical Field

Aspects of this document relate generally to systems and methods used for aligning substrates. More specific implementations involve semiconductor substrates.

2. Background

Semiconductor substrates are used to form a wide variety of semiconductor devices. The semiconductor devices are generally distributed across a planar surface of the semiconductor substrate in a plurality of die. The plurality of die are separated from one another using a singulation process like sawing.

SUMMARY

Implementations of a method for wafer alignment may include: providing a wafer having a first side and a second side and forming a seed layer on a second side of the wafer. The method may include applying a glop to the seed layer at two or more predetermined points and plating a metal layer over the seed layer and around the glop. The method may include removing the glop to expose the seed layer and etching the seed layer to expose a plurality of alignment features in the wafer.

Implementations of methods for wafer alignment may include one, all, or any of the following:

The method may further include using the plurality of alignment features to align the wafer for singulation, Applying the glop may further include using one of a stencil, a motor controlled dispenser, or a spray coater.

The metal layer may include gold, copper, nickel, or any combination thereof.

The glop may include photoresist, resin, or a polymeric material.

Implementations of a method for wafer alignment may include: providing a wafer having one or more die streets on a first side of the wafer and a seed metal layer on a second side of the wafer. The method may include applying a glop to an area of the second side of the wafer corresponding with the one or more die streets on the first side of the wafer. The method may include forming a layer of metal on the seed metal layer and etching the seed layer to expose two of the one or more die streets. The two or more die streets may each include a plurality of alignment features therein.

Implementations of methods for wafer alignment may include one, all, or any of the following:

The method may further include aligning the wafer using an infrared camera and singulating the wafer into a plurality of die.

Applying the glop may further include using one of a stencil, a motor controlled dispenser, or a spray coater.

The metal layer may include one of gold, copper, nickel, or any combination thereof.

The glop may include photoresist, resin, and a polymeric material.

Implementations of a method for wafer alignment may include: providing a wafer having a first side and a second side and applying a wafer backside coating to a second side of the wafer. The method may also include applying a glop to the backside coating at two or more predetermined points and plating a metal layer over the wafer backside coating and around the glop. The method may include removing the glop to expose the wafer backside coating and removing the wafer backside coating to expose a plurality of alignment features in the wafer.

Implementations of methods for wafer alignment may include one, all, or any of the following:

The method may further include aligning the wafer using an infrared camera and singulating the wafer into a plurality of die.

Applying the glop may further include using one of a stencil, a motor controlled dispenser, or a spray coater.

The metal layer may include one of gold, copper, nickel, and any combination thereof.

The glop may include photoresist, resin, or a polymeric material.

The wafer backside coating may be a seed metal layer.

Removing the seed layer may include etching.

The wafer backside coating may be opaque.

The wafer backside metal may include one of metal, oxides, or polymeric materials.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended method of aligning substrates will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such methods of aligning substrates, and implementing components and methods, consistent with the intended operation and methods.

For semiconductor die that are less than 50 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail.

Figure 1:
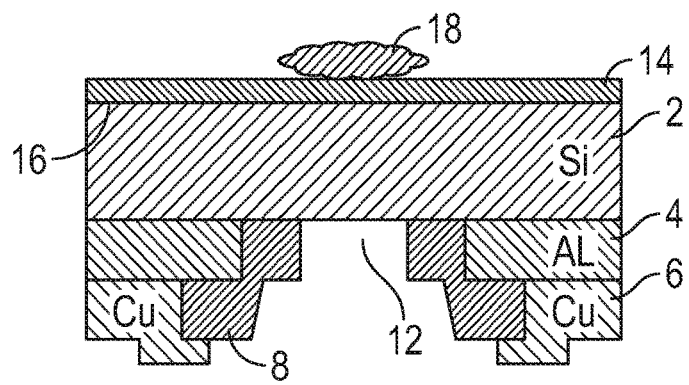
FIG. 1 is a cross sectional view of a substrate having a glop of photoresist on a wafer backside coating.

Referring to FIG. 1, a cross sectional side view of a substrate 2 coupled to a plurality of layers is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

In various implementations disclosed in this document, the semiconductor substrate 2 includes a plurality of semiconductor die that have been processed using a semiconductor fabrication process to form one or more semiconductor devices therein or thereon (not shown). This may include forming a plurality of layers on a first side 8 the substrate 2. The plurality of layers may be patterned, and in various implementations, may be patterned (or otherwise removed) to not be over a die street 12 in the substrate 2. The plurality of layers may include, by non-limiting example, one or more metal layers 4 and 6, one or more passivation layers 8, any other layer, and any combination thereof. In various implementations, the plurality of die may include power semiconductor devices, such as, by non-limiting example, a MOSFET, an IGBT, or any other power semiconductor device. In other implementations, the plurality of die may include non-power semiconductor devices.

In FIG. 1, the die are illustrated on either side of the die street 12. In various implementations, the die include aluminum, copper, and other conductive materials. Following the completion of the fabrication process (or during some portion of it, in some implementations), the semiconductor substrate 2 is thinned on a side of the semiconductor substrate 2 that is opposite the side on which the one or more semiconductor devices have been formed to a desired substrate thickness. The thinning process takes place using backgrinding, lapping, chemical etching, any combination thereof, or any other technique for removing the material of the semiconductor substrate 2 substantially uniformly across the largest planar surface of the substrate.

In various implementations, the substrate 2 may be thinned to a thickness less than 50 microns ($\mu m$). In other implementations, the substrate 2 may be thinned to a thickness less than 30 $\mu m$. In still other implementations, the substrate 2 may be thinned to a thickness less than 100 $\mu m$, more than 100 $\mu m$, and in other various implementations, the substrate 2 may not be thinned. In particular implementations, the substrate 2 may be thinned to a thickness of 25 $\mu m$, and in other particular implementations, the substrate may be thinned to a thickness of 75 $\mu m$. The substrate 2 may be thinned through backgrinding, etching, or any other thinning technique.

In various implementations, the thinning process may create an edge ring around the wafer (like that present in the backgrinding process marketed under the tradename TAIKO by Disco Hi-Tec America, Inc. of Santa Clara, Calif.). The edge ring acts to structurally support the wafer following thinning so that no wafer carrier may need to be utilized during subsequent processing steps. In various implementations, the thinning process may be carried out after the semiconductor substrate 2 has been mounted to a backgrinding tape whether an edge ring is formed during backgrinding or not. A wide variety of backgrinding tapes may be employed in various implementations, including those that are compatible with subsequent plasma etching operations.

In various implementations, following the thinning process a back metal layer 14 is applied to the semiconductor die through, by non-limiting example, sputtering, evaporation, plating, or another metal deposition process. In particular implementations, the backside metal layer 14 may be copper or a copper alloy. In other implementations, the backside metal layer may include any other type of metal, metal alloy, or any combination thereof. In various implementations, the backside metal layer may be about 10 $\mu m$ thick. In other implementations, the backside metal layer may be more or less thick than 10 $\mu m$. The backside metal layer 14 may be evaporated onto the substrate 2, however, in other implementations (including implementations having thicker substrates), the backside metal layer 14 may be plated onto the substrate 2 or formed on the substrate using another technique. In various implementations, the outer surface 16 of the backside metal layer may subsequently be coated with a film or other layer in order to facilitate removal of any slag resulting from the laser ablation disclosed later herein.

Following the thinning process, the various die formed in the semiconductor substrate 2 need to be singulated from one another so they can be subsequently packaged into semiconductor packages. Traditional singulation methods include singulating die from a front side of a substrate. In such methods, alignment equipment such as cameras, lenses and motors is required to be positioned under a vacuum chuck. The vacuum chuck is required to hold the wafer in place during the singulation process giving the alignment microscope limited range across the wafer. However, the camera/microscope is unable to see through the vacuum chuck. In some traditional methods, the wafer is mounted to tape, which is also difficult for the microscope/camera to see through.

Figure 2:
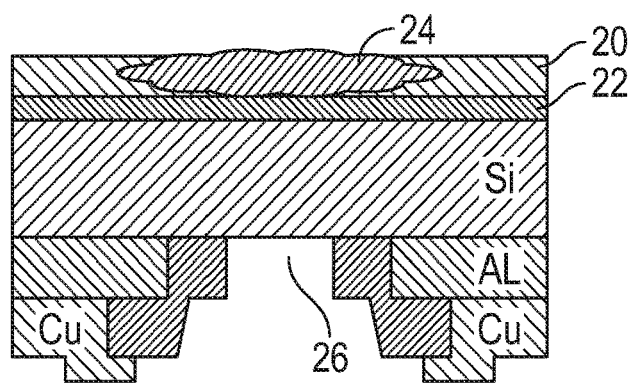
FIG. 2 is a cross sectional view of a substrate having a glop of photoresist on a seed layer and a metal layer formed around the glop.
Figure 3:
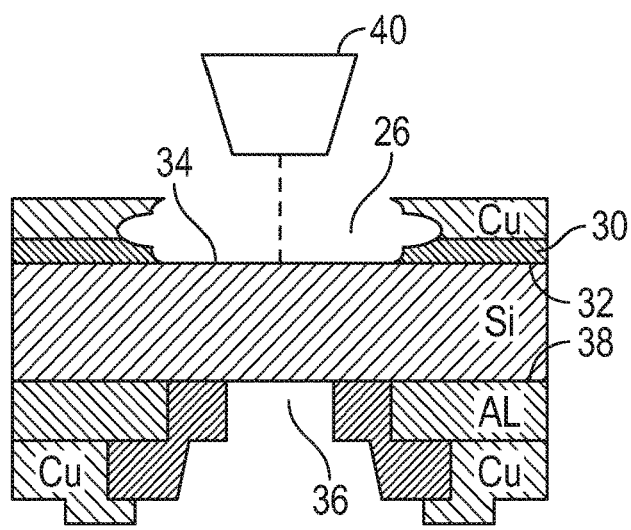
FIG. 3 is a cross sectional view of a substrate having a plurality of alignment features exposed on a second side of the substrate.

Referring to FIG. 1-3, an implementation of a method for wafer alignment is illustrated. In FIG. 1, a silicon substrate 2 is illustrated having a first side and a second side. In this particular implementation, the substrate includes a layer of aluminum 4 and a layer of copper 6 on a first side of the substrate and a passivation layer 10 formed around a die street 12. A portion of the copper extends over the passivation layer. In other implementations, the substrate may be formed of any other substrate material useful for constructing electronic devices as detailed above. In various implementations, the passivation material 10 may include, by non-limiting example, silicon nitride, silicon dioxide, polyimides, metal pads, underbump metallization (UBM), any combination thereof, and any other layer or material capable of facilitating electrical or thermal connection between the one or more semiconductor die and/or protecting the one or more semiconductor die from contaminants.

Referring to FIG. 1, a method for wafer alignment may include forming a seed layer 14 on a second side 16 of the wafer. In other implementations, the method may include applying a wafer backside coating to the second side of the wafer. In various implementations, the wafer backside coating may include a metal, an oxide, a polymeric material, a photoresist material, or other materials used in covering the backside of a semiconductor wafer or substrate. In still other implementations, the wafer backside coating may be opaque. In various implementations, the method for forming alignment marks may be carried out during the backside metallization. In other implementations, the method for forming alignment marks may be formed before the backside metallization of the substrate.

As illustrated in FIG. 1, the method also includes applying a glop 18 of photoresist to the seed layer 14. As used herein a glop describes an unpatterned, irregularly shaped portion, aggregation, glob, or amassed amount of photoresist, resin, polymeric material, or other material that is resistant to the chemicals used in forming and etching seed layers and metal layers used on the backside of a wafer. The glop 18 may applied on the second side 16 of the wafer in a location corresponding with one or more die streets 12 on the first side of the wafer. In some implementations, the method may include applying two or more glops to the seed layer. In various implementations, the glop can be applied by stencil, by hand without stencil, motor controlled dispenser like in epoxies, or by spray coater only in specific regions (spray of resist).

Areas for applying the glop for alignment may be determined by an alignment tool and located on any portion of the wafer. Aligning the wafer for singulation may include using a camera to find two or more alignment features in the substrate. In some methods of aligning a wafer, three alignment features may be located in order to triangulate a location on the wafer. The alignment features may be located in/on any layer of the substrate. In various implementations, the alignment features may be located using an infrared camera. The infrared camera may be able to penetrate through layers of silicon to locate the alignment features. In other implementations, the alignment features may be located on an outer surface of the substrate. In some implementations, the alignment features may be visible with a visible light camera. During alignment of the substrate, a first side of the wafer may be coupled with a chuck. In some implementations, the chuck may be a vacuum chuck. In various methods of aligning a wafer as described herein, dicing tape may be used to secure the first side of the wafer during alignment.

Referring to FIG. 2, the method includes plating a metal layer 20 over the seed layer 22 and around the glop 24. In various implementations, the metal layer may be gold, copper, nickel, an alloy, or any combination thereof. By non-limiting example, the metal layer may be applied through sputtering, evaporation, metal plating and other methods of forming a metal layer on a backside of a semiconductor wafer. The metal layer 20 may surround the glop 24. Applying the glop may include blanket coating or gross deposition of photoresist or another polymer (photosensitive or not) as illustrated in FIG. 2. Gross deposition of photoresist may help to form an area in the metal layer large enough to view a plurality of alignment features in the wafer. In various implementations, the alignment features may be located in the die streets 26 on the first side of the wafer.

Referring to FIG. 3, the method further includes removing the glop 28. The glop is removed to expose the seed layer 30 on the second side 32 of the wafer. In implementations of this method, development of photoresist may not be required (so non-photosensitive polymer materials may also be employed). The method includes etching the seed layer 30 to expose a plurality of alignment features 34 on the second side 32 of the wafer. In various implementations, removal of the seed layer may expose two or more die streets 36 on the first side 38 of the wafer. Where a seed layer is not used, the step of etching the seed layer is also not used. The die streets 36 may be visible through the second use of the wafer using infrared microscopy/cameras. As illustrated, a camera 40 is then used to align the wafer through the second side of the wafer using exposed alignment marks in the opening in the seed layer. In various implementations, the alignment features may be located in die streets. In other implementations, the alignment features may be located on an edge of the die. As described above, alignment of the wafer may include locating two or more alignment features using a camera. The wafer may be coupled with a chuck including but not limited to a vacuum chuck. In this particular method of aligning a wafer, alignment hardware including, but not limited to, cameras, lenses and motors is not required to be utilized under the vacuum chuck. Because of this, standard vacuum chuck designs may be used in implementations of this method.

The method may further include singulating the wafer into a plurality of die. The wafer may be singulated through one of lasering or sawing. In various implementations, plasma etching may be used to singulate the wafers when thinning or grooving of the metal layer and seed layer is performed. In some implementations, jet ablation may be used to singulate the wafer into a plurality of die.

Figure 4:
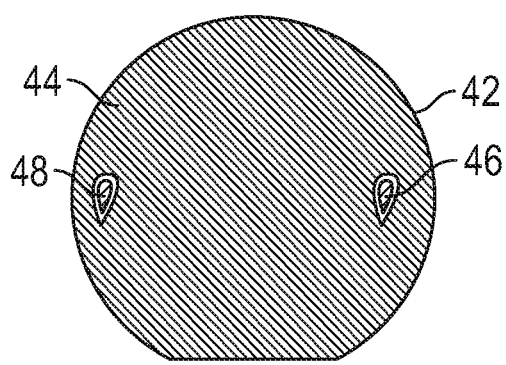
FIG. 4 is a top view of a substrate having a glop of photoresist on a wafer backside coating.
Figure 5:
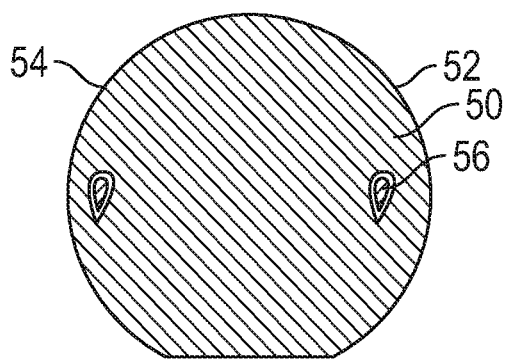
FIG. 5 is a top view of a substrate having a glop of photoresist on a seed layer and a metal layer formed around the glop.
Figure 6:
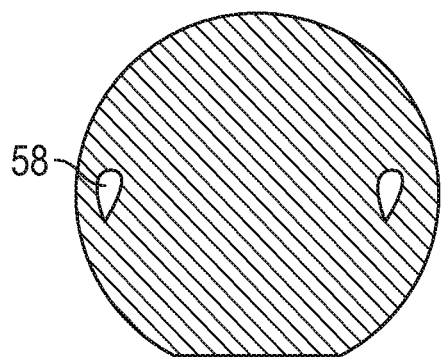
FIG. 6 is a cross sectional view of a substrate having a plurality of alignment features exposed on a second side of the substrate.

Referring to FIGS. 4-6, a method of an implementation of forming alignment features for a substrate/wafer is illustrated from a top view. From the top view only the second side of the wafer is visible. The first side of the wafer includes a plurality of die formed in the semiconductor material. In various implementations the plurality of die may include aluminum, copper, or any combination thereof. The plurality of die may be separated by a plurality of die streets. In various implementations, die streets are the area of the wafer that is cut/removed during the singulation process. A plurality of alignment features may be located within the die streets. The alignment features may be used to visually align the semiconductor wafer on a chuck with a tool used for cutting through the wafer.

Referring to FIG. 4, the method includes providing a wafer 42 having one or more die streets on a first side of the wafer. The wafer has been thinned to a thickness between about 8 microns and about 50 microns. The wafer includes a seed metal layer 44 on the second side of the wafer. In various implementations, the wafer may include a wafer backside coating. In various implementations, the wafer backside coating may include a metal, an oxide, polymeric material, or other materials used in covering the backside of a semiconductor wafer or substrate. The wafer backside coating may be applied using a spray coating method. Either the wafer backside coating or the seed metal layer may be applied after thinning of the wafer. In various implementations, the seed layer may not be used.

The method also includes applying a glop 46 to an area of the second side of the wafer corresponding with one or more dies streets on the first side of the wafer. As previously described the glop is dispensed as a free flowing amount of photoresist, resin, polymeric material, or other material that is resist to the chemicals used in forming and etching seed layers and metal layers used on the backside of a wafer. Two or more glops 48 may be applied to the second side of the wafer as illustrated. The glops 46 and 48 may be applied through blanket coating. In various implementations, the glop may include photoresist, resin, polymeric material, or other materials resistant to etching chemicals used in processing of semiconductor wafers. In some implementations, the glops may be applied using a stencil, a motor controlled dispenser, a spray coater, or other method for applying photoresist and similar materials to a wafer.

Referring to FIG. 5, the method includes forming a metal layer 50 on the seed layer 52 on the second side of the semiconductor wafer 54. In various implementations, the metal layer may be deposited on the wafer through one of plating, sputtering, evaporation, or other methods of depositing a metal layer to the backside of a semiconductor wafer. The metal layer may include, by non-limiting example, gold, copper, nickel, metal alloys, any metal used in a backside metallization, or any combination thereof. The metal layer may be deposited around the glop 56 to form an area on the second side of metal free from backside metallization.

Referring to FIG. 6, the method includes removing the glop 58 to expose the seed metal on the second side of the wafer. The method further includes etching the seed layer away to expose the second side of the wafer. Removing the seed layer exposes the semiconductor material and to view the plurality of alignment features located in the die street through a visible camera or infrared camera.

The method further includes aligning the wafer for singulation of the plurality of die. Aligning the wafer for singulation includes using a camera to find two or more alignment features in the substrate. In some methods of aligning a wafer, three alignment features may be located in order to triangulate a location on the wafer. The alignment features may be in any layer of the substrate. In various implementations, the alignment features may be located using an infrared camera. The infrared camera may be able to penetrate through layers of silicon to locate the alignment features. During alignment of the substrate, a first side of the wafer may be coupled with a chuck. In some implementations, the chuck may be a vacuum chuck. In various methods of aligning a wafer as described herein, dicing tape may be used to secure the first side of the wafer.

The method further includes singulating the wafer into a plurality of die. In some implementations, the wafer may be singulated through sawing. In other implementations, the die may be singulated through lasering. In various implementations, plasma etching may be used to singulate the wafers when thinning or grooving of the metal layer and seed layer is performed. In some implementations, jet ablation may be used to singulate the wafer into a plurality of die.

In places where the description above refers to particular implementations of methods of aligning a substrate and implementing components, sub-components, methods and sub-methods, it should be readily apparent that a number of modifications may be made without departing from the spirit thereof and that these implementations, implementing components, sub-components, methods and sub-methods may be applied to other methods of aligning a substrate.

What is claimed is:

1. A method for wafer alignment, the method comprising:
   providing a wafer comprising a first side and a second side;
   applying a glop to the second side at two or more predetermined points;
   forming a metal layer over the second side and around the glop; and
   removing the glop to expose the second side.

2. The method of claim 1, further comprising using a plurality of alignment features to align the wafer for singulation.

3. The method of claim 1, wherein applying the glop further comprises using one of a stencil, a motor controlled dispenser, or a spray coater.

4. The method of claim 1, wherein the metal layer comprises one of gold, copper, nickel, or any combination thereof.

5. The method of claim 1, wherein the glop comprises, photoresist, resin, or polymeric material.

6. A method for wafer alignment, the method comprising:
   providing a wafer comprising one or more die streets on a first side of the wafer, the wafer comprising a second side;
   applying a glop to an area of the second side of the wafer corresponding with the one or more die streets on the first side of the wafer;
   forming a metal layer on the second side; and
   removing the glop to expose the area of the second side corresponding with the one or more die streets, the one or more die streets each comprising a plurality of alignment features therein.

7. The method of claim 6, further comprising:
   aligning the wafer using an infrared camera; and
   singulating the wafer into a plurality of die.

8. The method of claim 6, wherein applying the glop further comprises using one of a stencil, a motor controlled dispenser, or a spray coater.

9. The method of claim 6, wherein the metal layer comprises one of gold, copper, nickel, or any combination thereof.

10. The method of claim 6, wherein the glop comprises, photoresist, resin, or polymeric material.

11. A method for wafer alignment, the method comprising:
    providing a wafer comprising a first side and a second side;
    applying a glop to the second side at two or more predetermined points;
    forming a metal layer over the second side and around the glop; and
    removing the glop to expose the second side thereby exposing a plurality of alignment features in the wafer.

12. The method of claim 11, further comprising:
    aligning the wafer using an infrared camera; and
    singulating the wafer into a plurality of die.

13. The method of claim 11, wherein applying the glop further comprises using one of a stencil, a motor controlled dispenser, or a spray coater.

14. The method of claim 11, wherein the metal layer comprises one of gold, copper, nickel, or any combination thereof.

15. The method of claim 11, wherein the glop comprises, photoresist, resin, or polymeric material.

16. The method of claim 11, wherein the metal layer comprises one of metal, oxides, or polymeric materials.

\* \* \* \* \*